(12) United States Patent
Ziesler

(10) Patent No.: US 12,567,872 B2
(45) Date of Patent: Mar. 3, 2026

(54) LDPC DECODER AND MINIMUM VALUE SEARCHING METHOD

(71) Applicant: Cortina Access, Inc., San Jose, CA (US)

(72) Inventor: Sebastian Havluj Ziesler, San Jose, CA (US)

(73) Assignee: REALTEK SINGAPORE PRIVATE LIMITED, Singapore (SG)

( * ) Notice: Subject to any disclaimer, the term of this patent is extended or adjusted under 35 U.S.C. 154(b) by 71 days.

(21) Appl. No.: 18/664,686

(22) Filed: May 15, 2024

(65) Prior Publication Data

US 2025/0119160 A1 Apr. 10, 2025

Related U.S. Application Data

(60) Provisional application No. 63/542,311, filed on Oct. 4, 2023.

(51) Int. Cl.
H03M 13/11 (2006.01)

(52) U.S. Cl.
CPC .... H03M 13/1117 (2013.01); H03M 13/1125 (2013.01); H03M 13/1134 (2013.01)

(58) Field of Classification Search
CPC .......... H03M 13/1117; H03M 13/1125; H03M 13/1134; H03M 13/112; H03M 13/1122; H03M 13/114; H03M 13/616; H03M 13/1102
See application file for complete search history.

(56) References Cited

U.S. PATENT DOCUMENTS

| | | | |
|---|---|---|---|
| 2005/0210366 A1* | 9/2005 | Maehata | H03M 13/1122 714/794 |
| 2010/0275088 A1* | 10/2010 | Graef | H04L 1/0057 714/752 |
| 2012/0297273 A1 | 11/2012 | Sakaue et al. | |
| 2013/0275827 A1* | 10/2013 | Wang | G06F 11/1076 714/752 |
| 2015/0254130 A1* | 9/2015 | Sakaue | H03M 13/1137 714/764 |
| 2016/0241360 A1* | 8/2016 | Motozuka | H04L 1/0052 |

(Continued)

FOREIGN PATENT DOCUMENTS

| | | |
|---|---|---|
| CN | 112632911 A | 4/2021 |
| CN | 115425988 A | 12/2022 |
| WO | 2007126328 A1 | 11/2007 |

OTHER PUBLICATIONS

Fossorier, M.P.C., et al.; "Reduced Complexity Iterative Decoding of Low-Density Parity Check Codes Based on Belief Propagation;" IEEE Transactions on Communications; vol. 47; No. 5; May 1999; pp. 673-680.

*Primary Examiner* — Steve N Nguyen
(74) *Attorney, Agent, or Firm* — McClure, Qualey & Rodack, LLP

(57) ABSTRACT
An LDPC decoder includes a storage unit and one or more computing engine. The storage unit stores an LDPC matrix. The computing engine performs an LDPC decoding algorithm to estimate a decoding result for a codeword based on the LDPC matrix. The computing engine includes a minimum value searching unit to output a minimum value searching result based on a plurality of input values when the LDPC decoding algorithm performs a minimum value searching operation.

18 Claims, 7 Drawing Sheets

(56) References Cited

U.S. PATENT DOCUMENTS

| 2016/0294415 | A1 |   | 10/2016 | Sugihara et al. |
| 2018/0062666 | A1 | * | 3/2018 | Zhang ................ H03M 13/1122 |
| 2020/0218607 | A1 |   | 7/2020 | Ha et al. |

* cited by examiner

LDPC DECODER AND MINIMUM VALUE SEARCHING METHOD

CROSS-REFERENCE TO RELATED APPLICATION

This non-provisional application claims priority under 35 U.S.C. § 119(e) to U.S. Provisional Application 63/542,311 filed on Oct. 4, 2023, the entire contents of which are hereby incorporated by reference.

BACKGROUND OF THE INVENTION

Technical Field

The present invention relates to communication decoding technology, in particular to an LDPC decoder and a minimum value searching method.

Related Art

Low density parity check (LDPC) codes are widely used as error correction codes for passive optical networks (PON), Ethernet and other data communication protocols because the error correction capabilities of LDPC codes are very close to the theoretical maximum (i.e., Shannon Limit). A common algorithm used to perform decoding and error correction of LDPC codes is the minimum-sum algorithm.

One way to implement the minimum-sum engine is to compare a current minimum value with a value to be compared to obtain a new minimum value, and thus iteratively complete comparisons of all values to be compared. However, this method (using Linear minimum compare/mux) is quite slow because each of the comparisons requires a comparator and a multiplexer to complete the computation, thus requiring a quantity of comparators and multiplexers that are linearly related to the quantity of values to be compared.

Another way to implement the minimum-sum engine is to compare every two values to be compared in a tree-like manner to obtain a minimum value (first layer), and then compare every two of these minimum values (second layer), and so on until the tree is reduced to a final result. Although this method (using tree minimum compare/mux) is faster than the previous method (using Linear minimum compare/mux), the tree structure results in the need for a log-base-2 number of layers of the quantity of the values to be compared. For example, 17 to 32 values to be compared would require five layers of comparators and multiplexers. Pipelining between layers does not help accelerate the computation speed because the final result needs to be used in the next round of the computations. If the tree is pipelined, the first stage of the tree must wait until the last stage of the tree completes the first iteration before starting the second iteration. Therefore, the overall computation time remains the same.

SUMMARY OF THE INVENTION

In view of this, an embodiment of the present invention proposes an LDPC decoder and a minimum value searching method which utilize a flattened structure for computations, thereby increasing the computation speed.

In view of this, an embodiment of the present invention proposes an LDPC decoder and an LDPC decoding method (using flattened min-sum computation engine) which finds the minimum by flattening all the numbers of the set into one-hot vectors to perform the select across all at once with priority decode, rather than iteratively comparing two numbers against each other in either a linear fashion or in a tree based fashion.

In some embodiments, an LDPC decoder comprises a storage unit and at least one computing engine. The storage unit stores an LDPC matrix. The computing engine performs an LDPC decoding algorithm to estimate a decoding result for a codeword based on the LDPC matrix. The computing engine comprises a minimum value searching unit to output a minimum value searching result based on a plurality of input values when the LDPC decoding algorithm performs a minimum value searching operation. The minimum value searching unit performs the following: converting the input values into a plurality of one-hot vectors, wherein each of the one-hot vectors comprises a plurality of one-hot bits, and the one-hot bits in the same one-hot vector respectively correspond to a non-repeating one-hot bit index; creating a plurality of first vectors, wherein each of the first vectors corresponds to a non-repeating target bit index among the one-hot bit indexes, and each of the first vectors presents a result of performing an OR operation between the one-hot bits of the target bit index; and priority decoding the first vectors in the order of the one-hot bit indexes from the least significant bit (LSB) to the most significant bit (MSB) to obtain a minimum value, wherein the minimum value is the target bit index corresponding to the first one of the first vector with a value of "1", and the minimum value searching result comprises the minimum value.

In some embodiments, a minimum value searching method is executed by a decoder. The minimum value searching method is adapted to output a minimum value searching result based on a plurality of input values, and comprises converting the input values into a plurality of one-hot vectors, wherein each of the one-hot vectors comprises a plurality of one-hot bits, and the one-hot bits in the same one-hot vector respectively correspond to a non-repeating one-hot bit index, creating a plurality of first vectors, wherein each of the first vectors corresponds to a non-repeating target bit index among the one-hot bit indexes, and each of the first vectors presents a result of performing an OR operation between the one-hot bits of the target bit index, and priority decoding the first vectors in the order of the one-hot bit indexes from the least significant bit (LSB) to the most significant bit (MSB) to obtain a minimum value, wherein the minimum value is the target bit index corresponding to the first one of the first vector with a value of "1", and the minimum value searching result comprises the minimum value.

According to the LDPC decoder and the minimum value searching method of some embodiments of the present invention, the minimum value, the second minimum value or/and the minimum value which has undergone the offset procedure can be quickly found through the flattened structure, which can meet the needs of efficient decoding for high-speed communication.

BRIEF DESCRIPTION OF THE DRAWINGS

The disclosure will become more fully understood from the detailed description given herein below for illustration only, and thus not limitative of the disclosure, wherein.

DETAILED DESCRIPTION OF THE INVENTION

Figure 1:
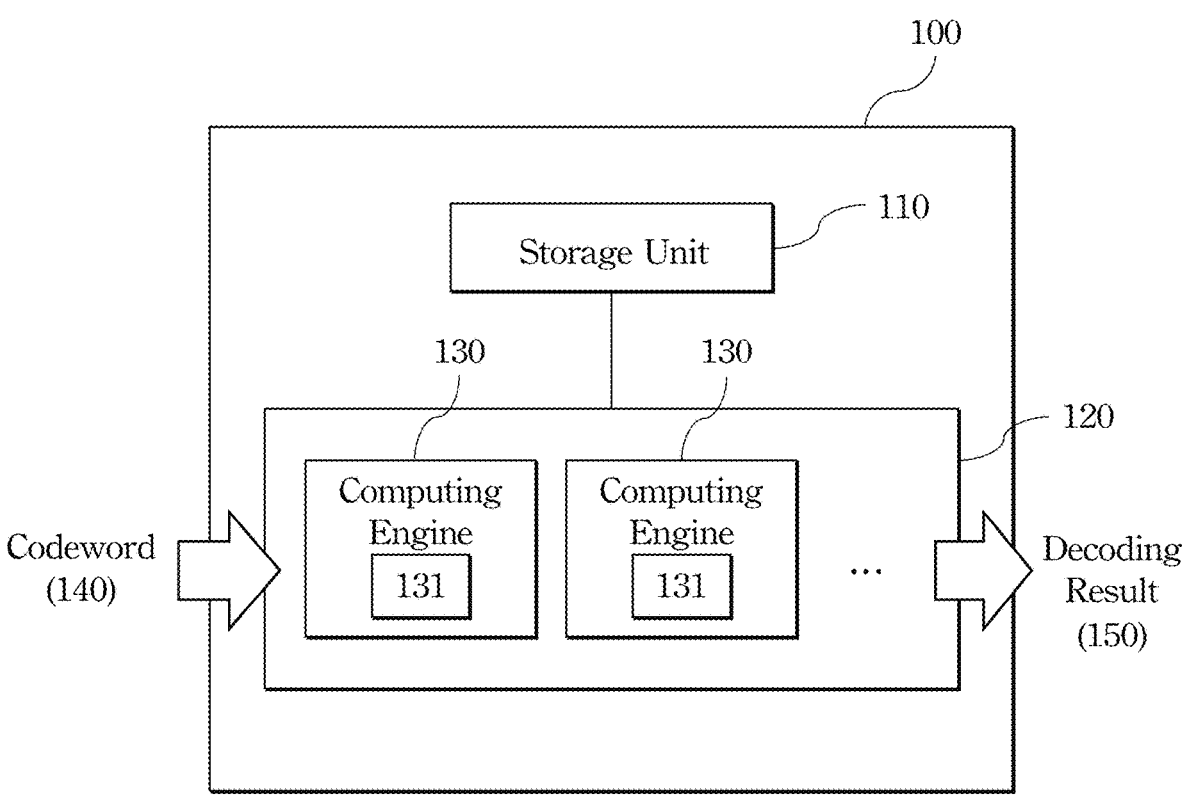
FIG. 1 illustrates a structural schematic view of an embodiment of an LDPC decoder.
Figure 2:
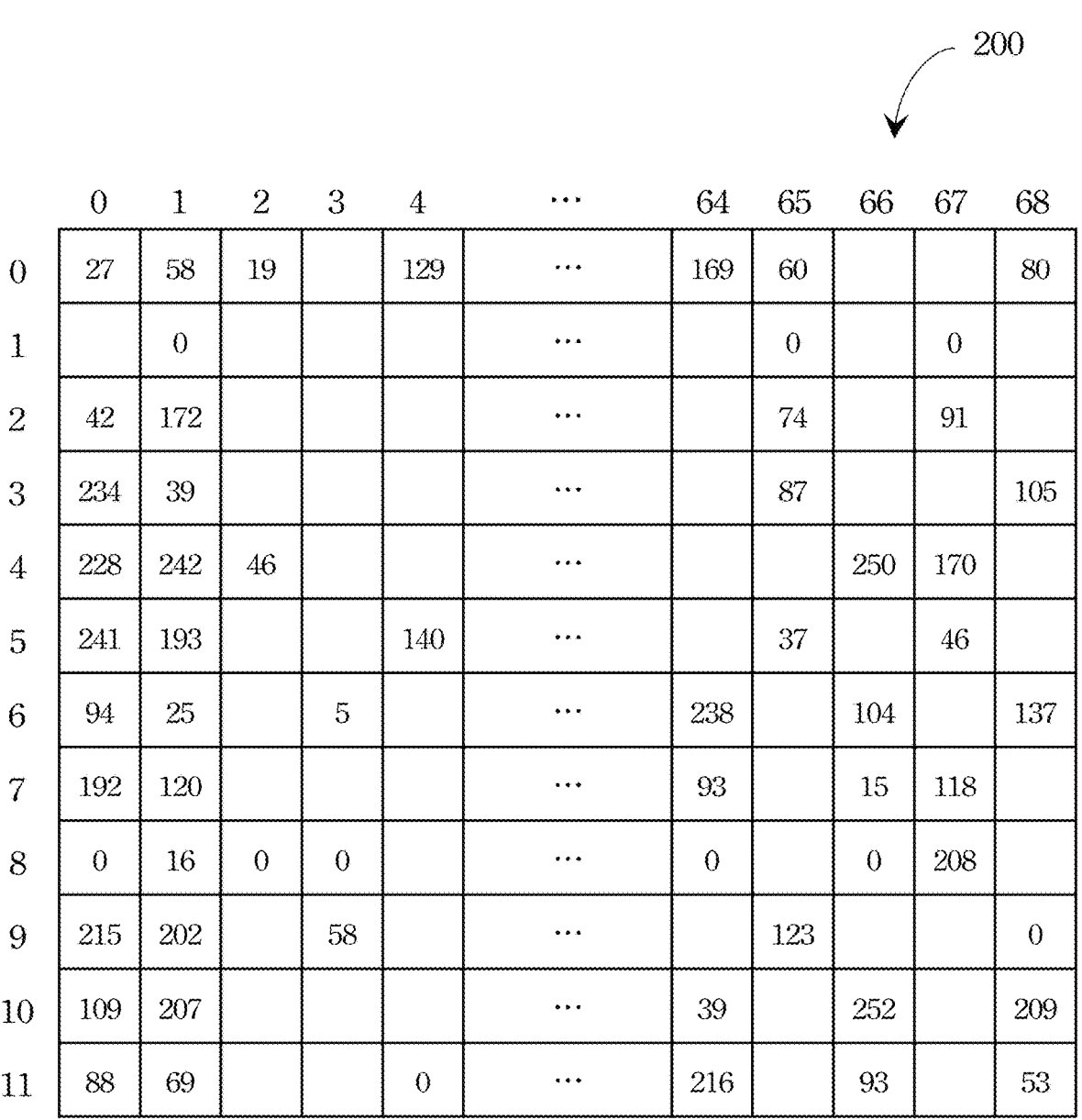
FIG. 2 illustrates a partial schematic view of an embodiment of an LDPC matrix.

Please refer to FIG. 1. An LDPC decoder 100 comprises a storage unit 110 and a flattened min-sum computation engine 120 to execute an LDPC decoding method. The storage unit 100 stores an LDPC matrix 200 (as shown in FIG. 2). The flattened min-sum computation engine 120 is a block of computing engine 130 which is replicated many times. After obtaining a codeword 140, the computing engine 130 executes an LDPC decoding algorithm to estimate a decoding result 150 for the codeword 140 based on the LDPC matrix. A minimum value searching unit 131 in the computing engine 130 finds the minimum by flattening all the numbers of the set into one-hot vectors to perform the select across all at once with priority decode, rather than iteratively comparing two numbers against each other in either a linear fashion or in a tree based fashion.

Please refer to FIG. 2. Taking the LDPC matrix 200 used in 25G PON (passive optical network) as an example, the LDPC matrix 200 is a 17664×3072 sparse matrix composed of a 69×12 array of 256×256 sub-matrices. Each grid shown in FIG. 2 represents a sub-matrix. Each of the sub-matrices is a zero matrix or a shifted identity matrix. The blank grids in the LDPC matrix 200 shown in FIG. 2 represent the zero matrices. The numbered grids in the LDPC matrix 200 shown in FIG. 2 represent the shifted identity matrices, and the number in the grid represents the shift number of the identity matrix. For example, if the number in the grid is "0", it indicates that the submatrix is the identity matrix. If the number in the grid is "5", it indicates that the submatrix undergoes a circular shift of 5 elements to the right for each row of the identity matrix. FIG. 2 only provides a specific example to illustrate the LDPC matrix 200 according to an embodiment of the present invention. The LDPC matrix 200 is not limited to the quantity of columns and rows shown in this example, nor is it limited to the positions and shift numbers of the sub-matrices shown in this example.

Each of the columns of the LDPC matrix 200 is regarded as a variable node, and the variable nodes respectively correspond to each bit of the codeword 140. Each of the rows of the LDPC matrix 200 is regarded as a check node, and each of the check nodes corresponds to a check equation. An element of "1" in the LDPC matrix 200 indicates that the check node of the row where it is located has a connection with the variable node of the column where it is located. The LDPC decoding algorithm is based on an iterative belief propagation algorithm. The variable nodes and the check nodes transmit computed update information to each other through the connections.

Figure 3:
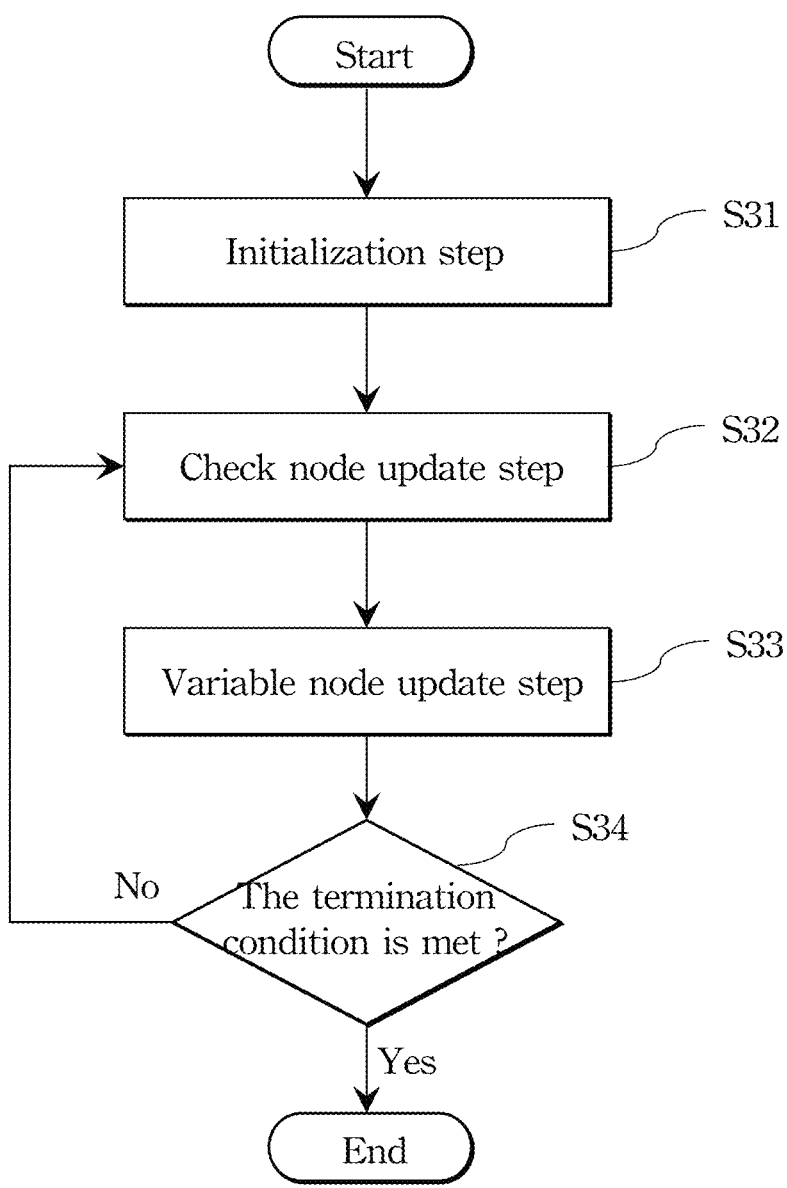
FIG. 3 illustrates a flowchart of an embodiment of an LDPC decoding algorithm.

Please refer to FIG. 3. Step S31 is an initialization step, where the information of the variable nodes and the check nodes is initialized. Step S32 is a check node update step, where the check nodes perform update operations based on the information from the connected variable nodes. Step S33 is a variable node update step, where the variable nodes perform update operations based on the information from the connected check nodes. Step S34 is a termination judgment step to determine whether a termination condition is met. If the termination condition is met, the procedure ends. If the termination condition is not met, the procedure returns to step S32 to continue the next iteration.

Please refer to Equation 1 and Equation 2. Equation 1 and Equation 2 are the initialization equations for step S31. The variable nodes perform information initialization according to Equation 1. The check nodes perform information initialization according to Equation 2. In Equation 1 and Equation 2, i represents the number of the iterations, N is the total quantity of the variable nodes, M is the total quantity of the check nodes, n represents the ordinal of the n-th variable node, m represents the ordinal of the m-th check node. $N_m$ represents the set of all variable nodes connected to the m-th check node, $M_n$ represents the set of all check nodes connected to the n-th variable node, $\lambda_{n,m}^{(i=k)}$ represents the information passed by the n-th variable node to the m-th check node in the k-th iteration, $\mu_{m,n}^{(i=k)}$ represents the information passed by the m-th check node to the n-th variable node in the k-th iteration, $I_n$ represents intrinsic information of the n-th variable node, which expresses the posterior probability of the bit of the corresponding codeword 140 being 1 or 0, "∀" stands for "given any", and "∈" stands for "belongs to". In some embodiments, the intrinsic information is a log-likelihood ratio (LLR).

$$\lambda_{n,m}^{(i=0)} = I_n, \forall n \in \{1, \dots N\}, \forall n \in M_n \qquad \text{(Equation 1)}$$

$$\mu_{m,n}^{(i=0)} = 0, \forall m \in \{1, \dots M\}, \forall n \in N_m \qquad \text{(Equation 2)}$$

Please refer to Equation 3. Equation 3 is the update operation equation of the check nodes in step S32. In Equation 3, Π is the product symbol, sgn( ) is the sign function, which returns 0, 1, or −1 depending on whether the value inside the function is 0, positive, or negative, respectively, min( ) is the minimum value function, and $N_{m \backslash n}$ represents the set of all variable nodes connected to the m-th check node except for the n-th variable node.

$$\mu_{m,n}^{(i=k)} = \prod\nolimits_{n' \in N_{m \backslash n}} \mathrm{sgn}(\lambda_{n',m}^{(i)}) \cdot \min_{n' \in N_{m \backslash n}} \left( \left| \lambda_{n',m}^{(i)} \right| \right) \qquad \text{(Equation 3)}$$

Please refer to Equation 4. Equation 4 is the update operation equation of the variable nodes in step S33. In Equation 4, Σ is the summation symbol, and $M_{n \backslash m}$ represents the set of all check nodes connected to the n-th variable node except for the m-th check node.

$$\lambda_{n,m}^{(i=k)} = I_n + \sum\nolimits_{m' \in M_{n \backslash m}} \mu_{m',n}^{(i)} \qquad \text{(Equation 4)}$$

In step S34, a hard decision is performed to decode and determine whether the termination condition is met. If the termination condition is met, the procedure ends. The termination condition is that the decoding result 150 is correct or the number of the iterations exceeds a threshold. Please refer to Equation 5 and Equation 6. Equation 5 and Equation 6 are the computing equations for the hard decision. Equation 5 is used to compute the posterior probability $\lambda_n$ of each of the variable nodes. Based on the computing result of Equation 5, the value of each bit corresponding to each of the variable nodes, $z_n$, is determined by using Equation 6. That is, the decoding result 150 (sequence $z_1, z_2, \ldots, z_n$) is obtained. Equation 7 is used to confirm whether the decoding result 150 is correct (the decoding result 150 is correct if Equation 7 is satisfied), where H represents the LDPC matrix 200, and $z^T$ represents the transpose of the decoding result 150 (sequence $z_1, z_2, \ldots, z_n$).

$$\lambda_n = I_n + \sum_{m' \in M_n} \mu_{m',n}^{(i)} \qquad \text{(Equation 5)}$$

$$z_n = \begin{cases} 1, & \lambda_n < 0 \\ 0, & \lambda_n \geq 0 \end{cases} \qquad \text{(Equation 6)}$$

$$H \times z^T = 0 \qquad \text{(Equation 7)}$$

Based on the above explanation (such as Equation 3 and Equation 4), it can be seen that during the iteration process, the sum $$\lambda_{n,m}^{(i)}$$

of the information $$\mu_{m,n}^{(i)}$$

is computed, and the minimum value is identified. Therefore, the LDPC decoding algorithm described here is referred to as the minimum-sum algorithm. In the update operations of the check nodes (Equation 3), a minimum value searching operation is required to find the minimum value from the intrinsic information corresponding to the variable node set $N_{m \backslash n}$. Therefore, as shown in FIG. 1, each of the computing engines 130 comprises a minimum value searching unit 131. When the LDPC decoding algorithm performs the minimum value searching operation, the minimum value searching unit 131 performs a minimum value searching procedure and outputs a minimum value searching result based on a plurality of input values (here, the input values are the intrinsic information corresponding to the variable node set $N_{m \backslash n}$). In some embodiments, each of the input values is the intrinsic information of the corresponding variable node (such as the log-likelihood ratio).

In some embodiments, the quantity of the computing engines 130 is determined based on the quantity of the rows of the sub-matrix. As shown in the aforementioned example of FIG. 2, the quantity of the computing engines 130 is 256. Each of the computing engines 130 corresponds to a row (check node) in the sub-matrix, and performs a corresponding update operation (Equation 3). Therefore, the computing engines 130 can perform the operations of 256 rows (also referred to as one layer) in parallel at a time. After processing all layers of the LDPC matrix 200 sequentially (as shown in FIG. 2 with 12 layers), one iteration of the check node update is completed. There are a plurality of minimum value searching units 131 to perform the minimum value searching procedure corresponding to each of the rows located in the same layer of the LDPC matrix 200 in parallel. That is, one minimum value searching unit 131 performs the minimum value searching operations for one row.

Similarly, in some embodiments, the flattened min-sum computation engine 120 further comprises other computing engines (not shown in FIG. 2) to process all variable node updates sequentially in parallel, and the description will not be repeated here.

In some embodiments, the columns in the LDPC matrix 200 are merged into column groups. For example, as shown in FIG. 2, each of the rows of the 67th column and the 68th column has at most one non-zero matrix, so the 67th column and the 68th column can be merged into one column group. Similarly, the 65th column and the 66th column can also be merged into another column group. Due to the sparse nature of the LDPC matrix 200, merging into column groups can significantly reduce the quantity of the columns. Generally, after merging into column groups, the quantity of the columns can be reduced to around mid-twenties, for example, between 23 and 27 columns. In this way, the quantity of the input values for the minimum value searching operation can be reduced, but the present invention does not necessarily require the quantity of the input values to be less than 30. Since there is only one "1" in each of the columns in the shifted identity matrix, for the minimum value searching unit 131, each of the column groups corresponds to at most one input value. That is, the quantity of the input values that the minimum value searching unit 131 processes for the minimum value searching operation is at most equal to the quantity of the column groups. In some embodiments, the quantity of the input values processed by one minimum value searching unit 131 ranges from 23 to 69.

Figure 4:
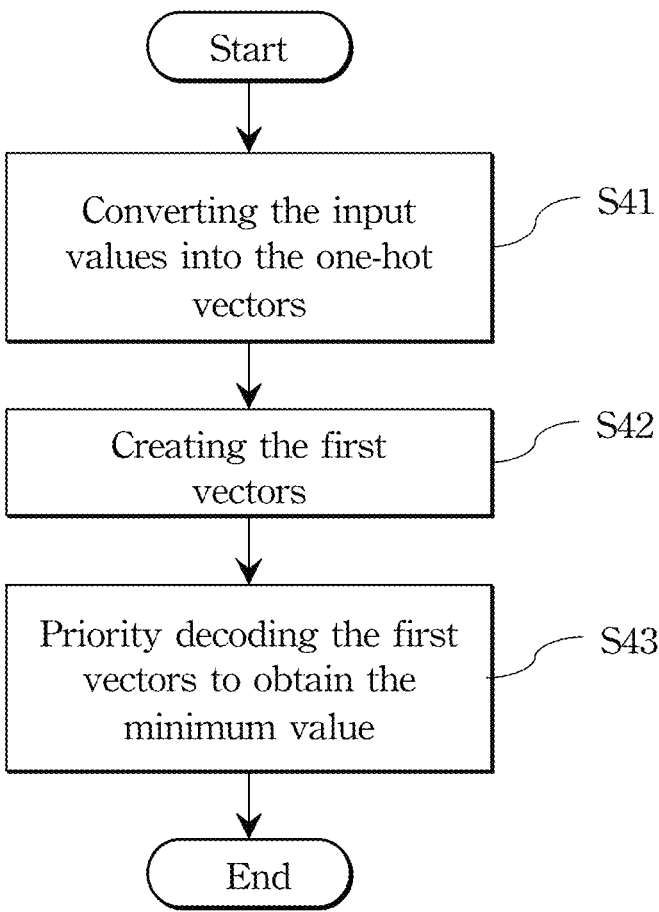
FIG. 4 illustrates the first flowchart of an embodiment of a minimum value searching operation.
Figure 5:
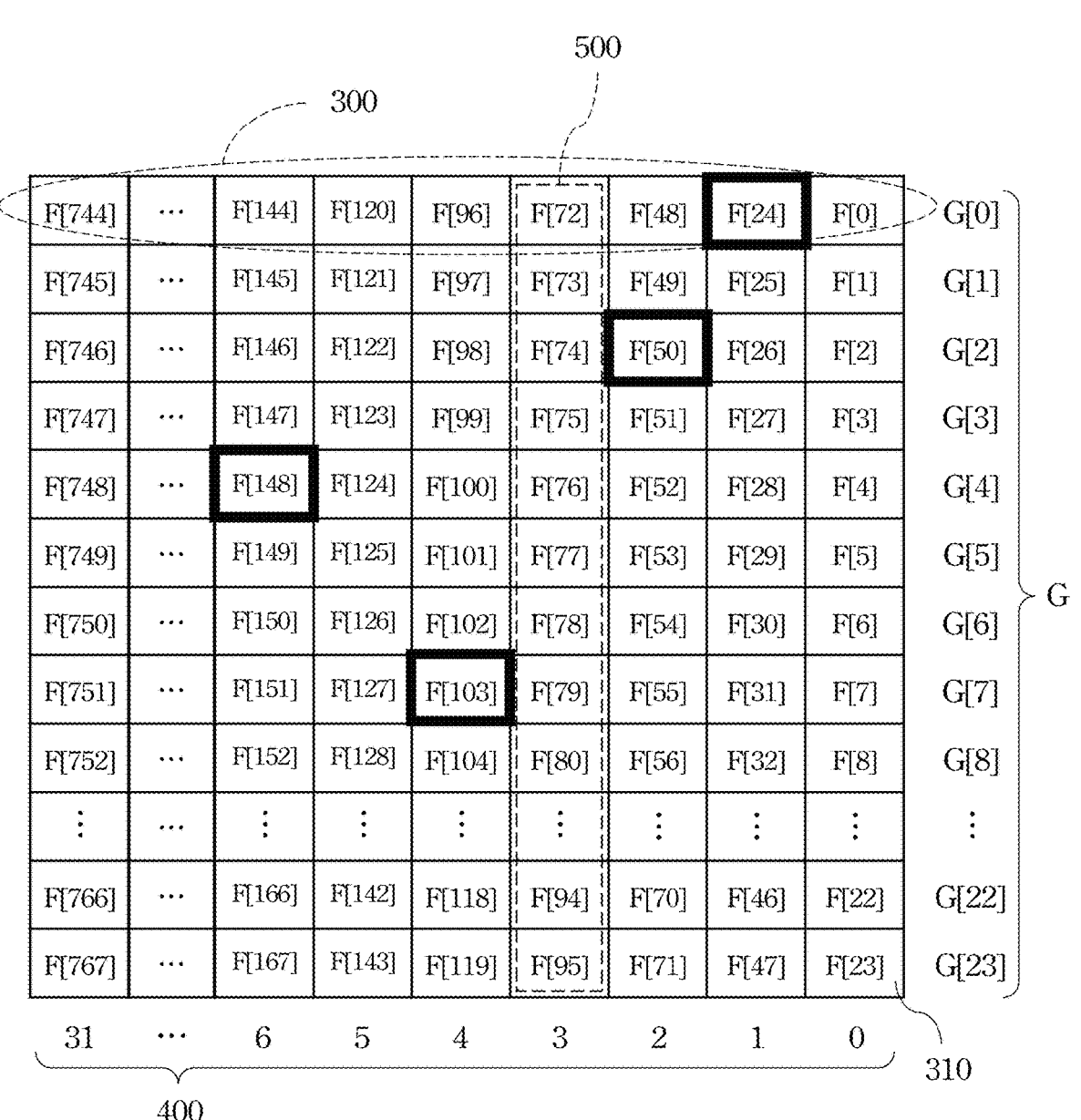
FIG. 5 illustrates a schematic view of an embodiment of a conversion of one-hot vectors.

Please refer to FIG. 4. Step S41 is a one-hot vector conversion step, which converts input values G into one-hot vectors 300 respectively. Please refer to FIG. 5. In some embodiments, a bit width of each of the input values G is 4 bits or 5 bits to achieve a balance between error correction capability and logic quantity. FIG. 5 illustrates 24 input values G[0] to G[23] with the bit width of 5 bits, but the quantity of input values G and the bit width of the input value are not limited thereto. Each of the one-hot vectors 300 comprises a plurality of bits (hereinafter referred to as one-hot bits 310), and the one-hot bits in the same one-hot vector respectively correspond to a non-repeating one-hot bit index 400. Here, the one-hot bit indexes 400 are "0" to "31", corresponding to the numbers represented in the one-hot vector 300. Taking the input value G[0] as an example, it is converted into the one-hot vector 300 composed of the one-hot bits 310 such as F[744], ..., F[168], F[144], F[120], F[96], F[72], F[48], F[24], F[0]. The value of the one-hot bit 310 marked with a solid thick frame is "1", and the value of the one-hot bit 310 not marked with the solid thick frame is "0". For example, the value of the input value G[0] is "6". After the input value G[4] is converted into the one-hot vector 300, the value of the one-hot bit 310 (F[148]) is "1", and the corresponding one-hot bit index 400 for the one-hot bit 310 (F[148]) is "6".

Please refer to Code 1, which is an embodiment of the one-hot vector 300 conversion. The input values G[0] to G[23] are compared with the one-hot bit index 400 one by one, and if they are the same, the corresponding one-hot bit 310 is set to "1".

---

Code 1:

```
F[0] = (G[0] == 0);
F[1] = (G[1] == 0);
...
F[23] = (G[23] == 0);
F[24] = (G[0] == 1);
...
F[767] = (G[23] == 31);
```

---

It should be noted that although FIG. 5 illustrates the relationship between the input values G and the one-hot vectors 300 in the form of a two-dimensional array. However, F[0] to F[767] is essentially a one-dimensional array, that is, a flattened vector. For the convenience of subsequent explanation, "0" to "767" are defined here as flattened bit indexes. Each of the flattened bit indexes corresponds one-to-one with the one-hot bits 310 of the one-hot vectors 300. The flattened vector comprises a plurality of connected sequences 500, each of the sequences 500 corresponding to each of the columns shown in FIG. 5. Each of the sequences 500 comprises the one-hot bits 310 in the same one-hot bit index 400 of the one-hot vectors 300. For example, the sequence 500 illustrated in FIG. 5 comprises the one-hot bits 310 (F[96] to F[119]) corresponding to the one-hot bit index 400 of 4 in each of the one-hot vectors 300. The one-hot bits 310 comprised in the sequences 500 are arranged in a same arrangement order. As shown in FIG. 5, the one-hot bits 310 comprised in the sequences 500 are arranged in order from top to bottom, and the arrangement order of the sequences 500 is consistent with the index order of the input values G[0] to G[23]. The sequences 500 are arranged in ascending order according to the corresponding one-hot bit index 400. For example, the sequence 500 comprising the one-hot bits 310 (F[0] to F[23]), its corresponding one-hot bit index 400 is "0"; the sequence 500 comprising the one-hot bits 310 (F[24] to F[47]), its corresponding one-hot bit index 400 is "1", and so on.

Please refer to FIG. 4, FIG. 5 and Code 2. Step S42 is to create a plurality first vectors. Each of the first vectors corresponds to a non-repeating target bit index among the one-hot bit indexes 400. For example, the one-hot bit index 400 corresponding to the first vector First_vector[0] is "0", the one-hot bit index 400 corresponding to the first vector First_vector[1] is "1", and so on. Each of the first vectors presents a result of performing an OR operation between the one-hot bits 310 of the target bit index in the one-hot vectors 300. For example, the first vector First_vector[0] presents the result of the OR operation between the one-hot bits 310 (F[0] to F[23]) whose one-hot bit index 400 is 0. Therefore, if a certain first vector is "1", it means that there is at least one one-hot vector 300 whose one-hot bit 310 corresponding to the target bit index is "1".

---

Code 2:

```
First_vector[0] = F[0] || F[1] || ... F[23];
First_vector[1] = F[24] || F[25] || ... F[47];
...
First_vector[31] = F[744] || F[755] || ... F[767]
```

---

Please refer to FIG. 4, FIG. 5 and Code 3. Step S43 is to priority decode the first vectors to obtain a minimum value. Specifically, according to the one-hot bit indexes 400, from the least significant bit (LSB) to the most significant bit (MSB) (here, from "0" to "31"), the minimum value is priority decoded from the first vectors. The minimum value is the target bit index corresponding to the first one of the first vector with a value of "1". Taking FIG. 5 as an example, the one-hot bit index 400 corresponding to the first one of the first vector with a value of "1" is "1", so the minimum value comprised in the minimum value searching result is "1".

---

Code 3:

```
foreach bit (0..31) last if(First_vector[bit]);
    Min_value = bit;
```

---

Figure 6:
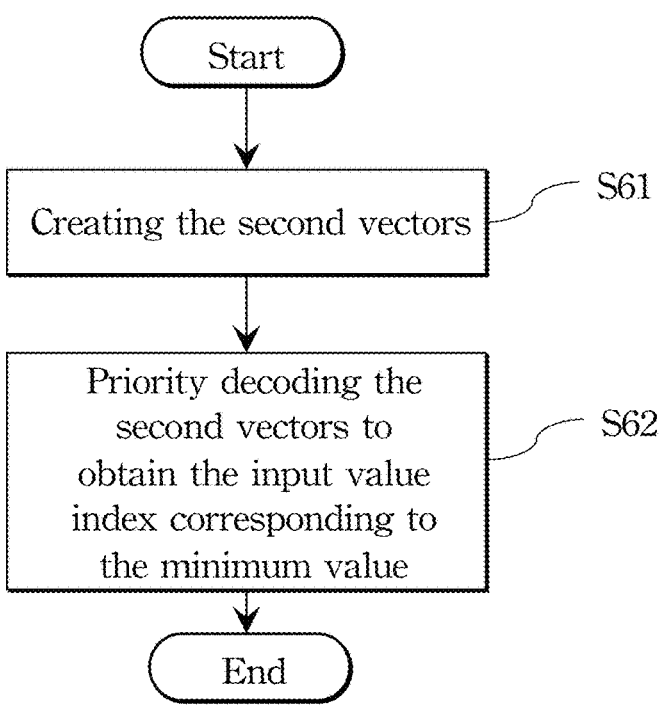
FIG. 6 illustrates the second flowchart of the embodiment of the minimum value searching operation.

Please refer to FIG. 5, FIG. 6 and Code 4. The procedure in FIG. 6 is configured to identify which of the input value G is the aforementioned minimum value. In step S61, a plurality of second vector are created. Each of the second vectors corresponds to a non-repeating target one-hot vector among the one-hot vectors 300. Each of the second vectors presents the result of performing an OR operation between a plurality of judgment results generated by performing a logical judgment for each of the one-hot bits 310 respectively in the target one-hot vector. The logical judgment is an intersection of a first condition and a second condition. The first condition is that the one-hot bit 310 undergoing the logical judgment is "1". The second condition is that for the one-hot bits 310 of the flattened bit indexes smaller than the flattened bit index of the one-hot bit 310 undergoing the logical judgment in the flattened vector are all "0". Taking the second vector Second_vector[0] as an example, it performs the logical judgment on each of the one-hot bits 310 (F[0], F[24], F[48], ..., F[744]) in its corresponding one-hot vector 300. For example, for F[24], the first condition is to determine whether F[24] is "1", and the second condition is to determine whether F[23:0] are both "0". If both conditions are true, it indicates that among F[24:0], F[24] is the first one-hot bit 310 which is "1". The input value G[0] corresponding to the one-hot vector 300 comprising this one-hot bit 310 is the input value with the minimum value. Additionally, since there are no flattened bit indexes smaller than F[0], only the first condition is evaluated for F[0], that is, whether F[0] is 1.

---

Code 4:

```
Second_vector[0] = F[0] || F[24] && (F[23:0]==0) || F[48] && (F[47:0]==0)...
F[744]&&(F[743:0]==0);
Second_vector[1] = F[1] || F[25] && (F[24:0]==0) || F[49] && (F[48:0]==0)...
F[745]&&(F[744:0]==0);
Second_vector[2] = F[2] || F[26] && (F[25:0]==0) || F[50] && (F[49:0]==0)...
F[746]&&(F[745:0]==0);
...
Second_vector[23] = F[23] || F[47]&&(F[46:0]==0)|| F[71] &&
(F[70:0]==0)...F[767]&&F[766:0]==0;
```

Please refer to FIG. 5, FIG. 6 and Code 5. Step S62 is to priority decode the second vectors to obtain the index of the input value G corresponding to the minimum value (hereinafter referred to as the "input value index"), so as to include the input value index in the minimum value searching result. Specifically, according to the arrangement order of the one-hot bits 310 in the sequence 500 (that is, the arrangement order of the input values G), the second vectors are priority decoded to obtain the input value index corresponding to the minimum value. The input value index is a sequence index of the arrangement order corresponding to are not all "0". Taking the third vector Third_vector[2] as an example, it performs logical judgments on each of the one-hot bits 310 (F[48]~F[71]) in its corresponding one-hot bit index 400 ("2") of the one-hot vectors 300. For example, for F[50], the third condition is to determine whether F[50] is "1", and the fourth condition is to determine whether F[49:0] are not all "0". If both conditions are true, it indicates that among F[50:0], F[49] is the second one-hot bit 310 which is "1". Additionally, since there are no flattened bit indexes smaller than F[0], the judgment for F[0] is omitted in the third vector Third_vector[0].

---

Code 6:

```
Third_vector[0] = F[1] &&!(F[0]==0) || F[2] && !(F[1:0]==0) || ... F[23]
&& !(F[22:0]==0);
Third_vector[1] = F[24] && !(F[23:0]==0) || F[25] && !(F[24:0]==0) ... F[47]
&& !(F[46:0]==0);
...
Third_vector[31] = F[744] && !(F[743:0]==0) || F[745] && !(F[744:0]==0) || ... F[767]
&& !(F[766:0]==0);
```

--- the first one of the second vector for which the logical judgment is true. As shown in FIG. 5, the one-hot bit 310 (F[24]) is the minimum value. Therefore, after the aforementioned step S61, the logical judgment of the second vector Second_vector[0] is true (indicated as "1"), and it is the first second vector for which the logical judgment is true. Thus, the input value index of the minimum value is "0" (that is, the index value of this second vector is also the same as the corresponding input value index).

---

Code 5:

```
foreach bit (0..23) last if(Second_vector[bit]);
Min_index = bit;
```

---

In some embodiments, the LDPC decoding algorithm uses a modification of the aforementioned minimum-sum algorithm, such as normalized minimum-sum algorithm, offset min-sum algorithm, etc., which, in addition to using the minimum value, a second minimum value is also used. In an example, when the input values G[2] and G[5] are both "3" and the other input values G are "4", then the minimum value is "3" and the second minimum value is also "3". In another example, when the input value G[1] is "2", the input value G[0] is "4", and other input values G are greater than "4", then the minimum value is "2" and the second minimum value is "4". The following explains how to obtain the second minimum value through the aforementioned flattened vector to provide the minimum value searching result comprising the second minimum value.

Figure 7:
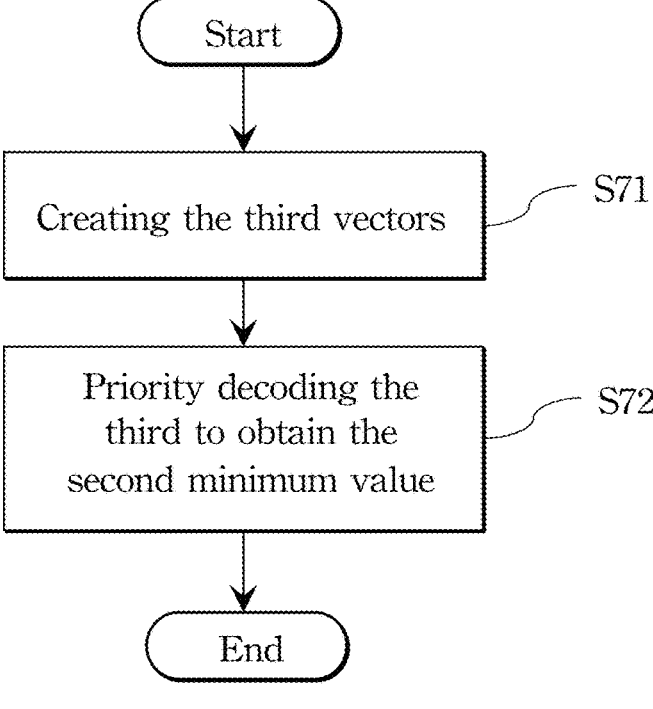
FIG. 7 illustrates a flowchart of an embodiment of a second minimum value searching operation.

Please refer to FIG. 5, FIG. 7 and Code 6. Step S71 is to create a plurality third vectors. Each of the third vectors corresponds to the non-repeating target bit index among the one-hot bit indexes 400. The third vector presents an intersection of a plurality of results generated by performing a logical judgment for each of the one-hot bits 310 respectively in the target bit index of the one-hot vectors 300. The logical judgment is an intersection of a third condition and a fourth condition. The third condition is that the one-hot bit 310 undergoing the logical judgment is "1". The fourth condition is that for the one-hot bits 310 of the flattened bit indexes smaller than the flattened bit index of the one-hot bit 310 undergoing the logical judgment in the flattened vector Please refer to FIG. 5, FIG. 7 and Code 7. Step S72 is to priority decode the third vectors to obtain the second minimum value. Specifically, according to the one-hot bit indexes 400, from the least significant bit (LSB) to the most significant bit (MSB), the second minimum value is priority decoded from the third vectors. The second minimum value is the target bit index corresponding to the first one of the third vector for which the logical judgment is true. As shown in FIG. 5, the one-hot bit 310 (F[50]) is the second minimum value. Therefore, after the aforementioned step S71, the logical judgment of the third vector Third_vector[2] is true (indicated as "1"), and it is the first third vector for which the logical judgment is true. Thus, the second minimum value is "2" (that is, the corresponding target bit index, which is also the index value of this third vector).

---

Code 7:

```
foreach bit (0..31) last if(Third_vector[bit]);
Third_min_value = bit;
```

---

In some embodiments, the minimum value used by some modifications of the minimum-sum algorithm (such as the aforementioned offset minimum-sum algorithm) is processed by an offset procedure. That is, the minimum value comprised in the minimum value searching result has undergone the offset procedure. The following explains how to perform the offset procedure on the minimum value.

Figure 8:
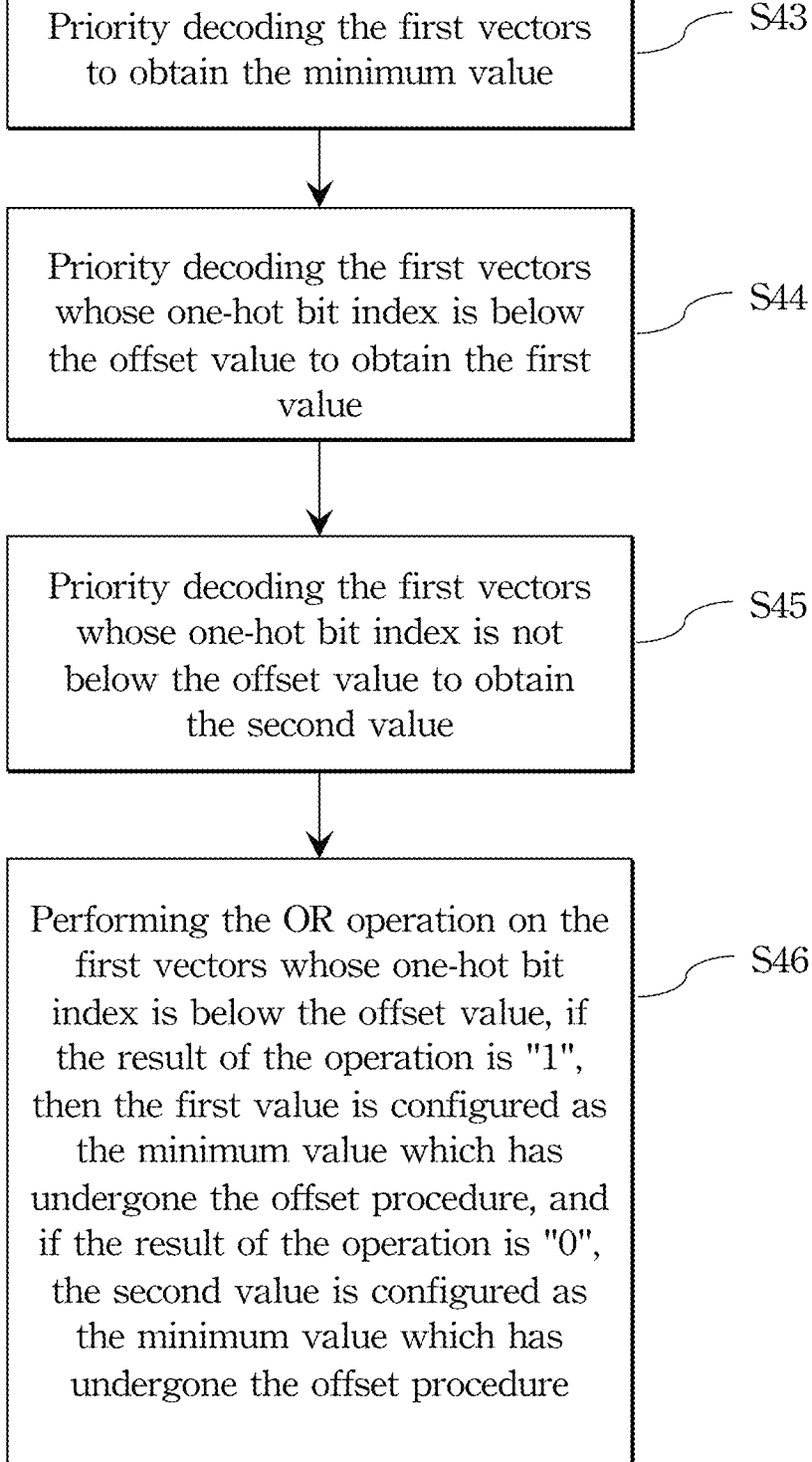
FIG. 8 illustrates the third flowchart of the embodiment of the minimum value searching operation.

Please refer to FIG. 5, FIG. 8 and Code 8 to Code 10. After obtaining the first vector according to the aforementioned step S43, the offset procedure of steps S44 to S46 is performed. Here, an offset value of "1" is used as an example, but the present invention is not limited thereto.

Step S44 is to priority decode the first vectors (First_vector[1:0]) whose one-hot bit index 400 is below the offset value to obtain a first value (bit_no_offset), as shown in Code 8. The first value (bit_no_offset) is the one-hot bit index 400 corresponding to the first one of the first vector with a value of "1". For example, if the first vector First_vector[0] is "1", the first value (bit_no_offset) is "0". If the first vector First_vector[0] is "0" and the first vector First_vector[1] is "1", the first value (bit_no_offset) is "1".

---

Code 8:

--- foreach bit_no_offset (0..1) last if(First_vector[bit_no_offset]);

---

Step S45 is to priority decode the first vectors (First_vector[31:2]) whose one-hot bit index 400 is not below the offset value to obtain a second value (bit_offset), as shown in Code 9. The second value (bit_offset) is obtained by subtracting the offset value from the one-hot bit index 400 corresponding to the first one of the first vector with a value of "1". For example, when the first vector First_vector[2] is "0" and the first vector First_vector[3] is "1", the second value (bit_offset) is "2".

Code 9:

for each bit_offset (1 . . . 30) last if(First_vector[bit_off-set+1]);

Step S46 is to perform an OR operation on the first vectors (First_vector[1:0]) whose one-hot bit index 400 is below the offset value. If a result of the operation is "1", it means that the minimum value appears in these first vectors, then the first value is configured as the minimum value which has undergone the offset procedure. If the result of the operation is "0", it means that the minimum value appears in other first vectors, the second value is configured as the minimum value which has undergone the offset procedure.

---

Code 10:

---

Min_value_with_offset = (First_vector[0] || First_vector[1]) ? bit_no_offset : bit_offset;

---

Compared with using the comparison logic method as shown in the Code 11, FIG. 8 performs the offset procedure based on the first vectors built from the flattened vectors, utilizing the flattened structure to increase the processing speed.

---

Code 11:

---

Min_value_with_offset = Min_value > 1 ? Min_value – 1 : Min_value;

---

The LDPC decoder and the minimum value searching method of some embodiments of the present invention can quickly find the minimum value, the second minimum value or/and the minimum value which has undergone the offset procedure through the flattened structure without the need for linear or tree-based iterative comparisons, which can meet the needs of efficient decoding for high-speed communication.

What is claimed is:

1. An LDPC decoder, comprising:

a storage unit storing an LDPC matrix; and at least one computing engine executing an LDPC decoding algorithm to estimate a decoding result for a codeword based on the LDPC matrix, wherein the at least one computing engine comprises a minimum value searching unit to output a minimum value searching result based on a plurality of input values when the LDPC decoding algorithm performs a minimum value searching operation;

wherein the minimum value searching unit performs the following:

converting the input values into a plurality of one-hot vectors, wherein each of the one-hot vectors comprises a plurality of one-hot bits, and the one-hot bits in the same one-hot vector respectively correspond to a non-repeating one-hot bit index;

creating a plurality of first vectors, wherein each of the first vectors corresponds to a non-repeating target bit index among the one-hot bit indexes, and each of the first vectors presents a result of performing an OR operation between the one-hot bits of the target bit index of the one-hot vectors; and priority decoding the first vectors in the order of the one-hot bit indexes from the least significant bit (LSB) to the most significant bit (MSB) to obtain a minimum value, wherein the minimum value is the target bit index corresponding to the first one of the first vector with a value of "1", and the minimum value searching result comprises the minimum value;

wherein there are a plurality of minimum value searching units to process a minimum value searching procedure corresponding to each of a plurality of rows located in the same layer of the LDPC matrix in parallel.

2. The LDPC decoder according to claim 1, wherein the one-hot vectors are comprised in a flattened vector, the flattened vector comprises a plurality of flattened bit indexes, each of the flattened bit indexes corresponds one-to-one with the one-hot bits of the one-hot vectors, the flattened vector comprises a plurality of connected sequences, each of the sequence comprises the one-hot bits in the same one-hot bit index of the one-hot vectors, the one-hot bits comprised in the sequences are arranged in a same arrangement order, and the sequences are arranged in ascending order according to the corresponding one-hot bit index.

3. The LDPC decoder according to claim 2, wherein the minimum value searching unit further performs the following:

creating a plurality of second vectors, wherein each of the second vectors corresponds to a non-repeating target one-hot vector among the one-hot vectors, and each of the second vectors presents the result of performing an OR operation between a plurality of judgment results generated by performing a logical judgment for each of the one-hot bits respectively in the target one-hot vector, the logical judgment is an intersection of a first condition and a second condition, the first condition is that the one-hot bit undergoing the logical judgment is "1", and the second condition is that for the one-hot bits of the flattened bit indexes smaller than the flattened bit index of the one-hot bit undergoing the logical judgment in the flattened vector are all "0"; and priority decoding the second vectors according to the arrangement order to obtain an input value index corresponding to the minimum value, wherein the input value index is a sequence index of the arrangement order corresponding to the first one of the second vector for which the logical judgment is true, and the minimum value searching result further comprises the input value index.

4. The LDPC decoder according to claim 2, wherein the minimum value searching unit further searches for a second minimum value among the input values, the minimum value searching unit further performs the following:

creating a plurality of third vectors, wherein each of the third vectors corresponds to the non-repeating target bit index among the one-hot bit indexes, and the third vector presents an intersection of a plurality of results generated by performing a logical judgment for each of the one-hot bits respectively in the target bit index of the one-hot vectors, the logical judgment is an intersection of a third condition and a fourth condition, the third condition is that the one-hot bit undergoing the logical judgment is "1", and the fourth condition is that for the one-hot bits of the flattened bit indexes smaller than the flattened bit index of the one-hot bit undergoing the logical judgment in the flattened vector are not all "0"; and priority decoding the third vectors in the order of the one-hot bit indexes from the least significant bit (LSB) to the most significant bit (MSB) to obtain the second minimum value, wherein the second minimum value is the target bit index corresponding to the first one of the third vector for which the logical judgment is true, and the minimum value searching result further comprises the second minimum value.

5. The LDPC decoder according to claim 1, wherein the minimum value searching unit further performs an offset procedure on the minimum value, and the minimum value comprised in the minimum value searching result is the minimum value which has undergone the offset procedure.

6. The LDPC decoder according to claim 5, wherein the offset procedure comprises:

priority decoding the first vectors whose one-hot bit index is below an offset value to obtain a first value, wherein the first value is the one-hot bit index corresponding to the first one of the first vector with a value of "1";

priority decoding the first vectors whose one-hot bit index is not below the offset value to obtain a second value, wherein the second value is obtained by subtracting the offset value from the one-hot bit index corresponding to the first one of the first vector with a value of "1"; and performing an OR operation on the first vectors whose one-hot bit index is below the offset value, wherein if a result of the operation is "1", then the first value is configured as the minimum value which has undergone the offset procedure, and if the result of the operation is "0", the second value is configured as the minimum value which has undergone the offset procedure.

7. The LDPC decoder according to claim 1, wherein each of the input values is a log-likelihood ratio (LLR).

8. The LDPC decoder according to claim 1, wherein each of the input values is 4 bits or 5 bits.

9. The LDPC decoder according to claim 1, wherein the quantity of the input values ranges from 23 to 69.

10. A minimum value searching method adapted to be executed by a decoder, wherein the minimum value searching method is adapted to output a minimum value searching result based on a plurality of input values, and wherein the minimum value searching method comprises:

converting the input values into a plurality of one-hot vectors, wherein each of the one-hot vectors comprises a plurality of one-hot bits, and the one-hot bits in the same one-hot vector respectively correspond to a non-repeating one-hot bit index;

creating a plurality of first vectors, wherein each of the first vectors corresponds to a non-repeating target bit index among the one-hot bit indexes, and each of the first vectors presents a result of performing an OR operation between the one-hot bits of the target bit index of the one-hot vectors; and priority decoding the first vectors in the order of the one-hot bit indexes from the least significant bit (LSB) to the most significant bit (MSB) to obtain a minimum value, wherein the minimum value is the target bit index corresponding to the first one of the first vector with a value of "1", and the minimum value searching result comprises the minimum value;

wherein the decoder comprises a plurality of minimum value searching units to process the minimum value searching method corresponding to each of a plurality of rows located in the same layer of a LDPC matrix in parallel.

11. The method according to claim 10, wherein the one-hot vectors are comprised in a flattened vector, the flattened vector comprises a plurality of flattened bit indexes, each of the flattened bit indexes corresponds one-to-one with the one-hot bits of the one-hot vectors, the flattened vector comprises a plurality of connected sequences, each of the sequence comprises the one-hot bits in the same one-hot bit index of the one-hot vectors, the one-hot bits comprised in the sequences are arranged in a same arrangement order, and the sequences are arranged in ascending order according to the corresponding one-hot bit index.

12. The method according to claim 11, further comprising:

creating a plurality of second vectors, wherein each of the second vectors corresponds to a non-repeating target one-hot vector among the one-hot vectors, and each of the second vectors presents the result of performing an OR operation between a plurality of judgment results generated by performing a logical judgment for each of the one-hot bits respectively in the target one-hot vector, the logical judgment is an intersection of a first condition and a second condition, the first condition is that the one-hot bit undergoing the logical judgment is "1", and the second condition is that for the one-hot bits of the flattened bit indexes smaller than the flattened bit index of the one-hot bit undergoing the logical judgment in the flattened vector are all "0"; and priority decoding the second vectors according to the arrangement order to obtain an input value index corresponding to the minimum value, wherein the input value index is a sequence index of the arrangement order corresponding to the first one of the second vector for which the logical judgment is true, and the minimum value searching result further comprises the input value index.

13. The method according to claim 11, further comprising:

creating a plurality of third vectors, wherein each of the third vectors corresponds to the non-repeating target bit index among the one-hot bit indexes, and the third vector presents an intersection of a plurality of results generated by performing a logical judgment for each of the one-hot bits respectively in the target bit index of the one-hot vectors, the logical judgment is an intersection of a third condition and a fourth condition, the third condition is that the one-hot bit undergoing the logical judgment is "1", and the fourth condition is that for the one-hot bits of the flattened bit indexes smaller than the flattened bit index of the one-hot bit undergoing the logical judgment in the flattened vector are not all "0"; and priority decoding the third vectors in the order of the one-hot bit indexes from the least significant bit (LSB) to the most significant bit (MSB) to obtain a second minimum value, wherein the second minimum value is the target bit index corresponding to the first one of the third vector for which the logical judgment is true, and the minimum value searching result further comprises the second minimum value.

14. The method according to claim 10, further comprising:

performing an offset procedure on the minimum value, wherein the minimum value comprised in the minimum value searching result is the minimum value which has undergone the offset procedure.

15. The method according to claim 14, wherein the offset procedure comprises:

priority decoding the first vectors whose one-hot bit index is below an offset to obtain a first value, wherein the first value is the one-hot bit index corresponding to the first one of the first vector with a value of "1";

priority decoding the first vectors whose one-hot bit index is not below the offset to obtain a second value, wherein the second value is obtained by subtracting the offset from the one-hot bit index corresponding to the first one of the first vector with a value of "1"; and performing an OR operation on the first vectors whose one-hot bit index is below the offset, wherein if a result of the operation is "1", then the first value is configured as the minimum value which has undergone the offset procedure, and if the result of the operation is "0", the second value is configured as the minimum value which has undergone the offset procedure.

16. The method according to claim 10, wherein each of the input values is a log-likelihood ratio (LLR).

17. The method according to claim 10, wherein each of the input values is 4 bits or 5 bits.

18. The method according to claim 10, wherein the quantity of the input values ranges from 23 to 69.

* * * * *